US008164396B2

(12) United States Patent  
Ishikawa et al.

(10) Patent No.: US 8,164,396 B2  
(45) Date of Patent: Apr. 24, 2012

(54) HARMONIC PROCESSING CIRCUIT AND AMPLIFYING CIRCUIT USING THE SAME

(75) Inventors: Ryo Ishikawa, Chofu (JP); Kazuhiko Honjo, Chofu (JP)

(73) Assignee: National University Corporation, The University of Electro-Communications, Tokyo (JP)

( * ) Notice: Subject to any disclaimer, the term of this patent is extended or adjusted under 35 U.S.C. 154(b) by 162 days.

(21) Appl. No.: 12/376,556

(22) PCT Filed: Aug. 1, 2007

(86) PCT No.: PCT/JP2007/065057  
§ 371 (c)(1),  
(2), (4) Date: May 14, 2010

(87) PCT Pub. No.: WO2008/018338  
PCT Pub. Date: Feb. 14, 2008

(65) Prior Publication Data  
US 2010/0283544 A1    Nov. 11, 2010

(30) Foreign Application Priority Data  
Aug. 8, 2006 (JP) ................... 2006-215181

(51) Int. Cl.  
  *H03F 3/60* (2006.01)  
  *H03H 7/38* (2006.01)  
(52) U.S. Cl. .......................... 333/33; 330/286  
(58) Field of Classification Search .............. 333/33; 330/286, 302  
See application file for complete search history.

(56) References Cited

U.S. PATENT DOCUMENTS  
5,473,281 A * 12/1995 Honjo ................. 330/286

FOREIGN PATENT DOCUMENTS

| JP | 05-259763 A | 10/1993 |
|---|---|---|
| JP | 08-148949 A | 6/1996 |
| JP | 2001-111362 A | 4/2001 |
| JP | 2001-237658 A | 8/2001 |
| JP | 2003-234626 A | 8/2003 |
| JP | 2005-117200 A | 4/2005 |

OTHER PUBLICATIONS

Inoue, A., et al., Analysis of Class-F and Inverse Class-F Amplifiers, Microwave Symposium Digest, 2000 IEEE MTT-S International 2:775-778, 2000. Wei, C.J., et al., Analysis and Experimental Waveform Study on Inverse Class Class-F Mode of Microwave Power Fets, Microwave Symposium Digest, 2000 IEEE MTT-S International 1:525-528, 2000.

Yun Woo, Y., et al., Analysis and Experiments for High-Efficiency Class-F and Inverse Class-F Power Amplifiers, IEEE Transactions on Microwave Theory and Techniques (54)5:1969-1974, May 2006.

* cited by examiner

*Primary Examiner* — Stephen Jones  
(74) *Attorney, Agent, or Firm* — Christensen O'Connor Johnson Kindness PLLC

(57) ABSTRACT

The present invention provides a harmonic processing circuit capable of miniaturizing a circuit, and an amplifier circuit using this harmonic processing circuit.

A first impedance adjustment section and a second impedance adjustment section are provided. The first impedance adjustment section is provided with a coupled distributed constant line CT. The coupled distributed constant line CT receive as input the output of an amplification transistor S, and have a length of ¼ the wavelength (λ) of the fundamental wave at the output of the amplification transistor S. Further, the first impedance adjusting section is configured to adjust input impedance with respect to the even harmonics to one of effectively infinity or zero. The first impedance adjusting section and the second impedance adjustment section are configured to adjust input impedance with respect to the odd harmonics to the other of effectively infinity or zero.

8 Claims, 18 Drawing Sheets a. short circuit termination b. open circuit termination a. short circuit termination b. open circuit termination a. each termination open circuit    b. each termination short circuit a. each termination open circuit　　　b. each termination short circuit a. each termination open circuit　　　b. each termination short circuit a. for inverse class F (even harmonics open circuit, odd harmonics short circuit)

b. for Class F (even harmonics short circuit, odd harmonics open circuit)

a. for inverse class F (even harmonics open circuit, odd harmonics short circuit)

b. for Class F (even harmonics short circuit, odd harmonics open circuit)

cross sectional structure

HARMONIC PROCESSING CIRCUIT AND AMPLIFYING CIRCUIT USING THE SAME

TECHNICAL FIELD

The present invention relates to a harmonic processing circuit, and to an amplifier circuit using this harmonic processing circuit.

BACKGROUND ART

Currently, mobile terminals, exemplified by mobile phones, are spreading prolifically, and in order to enable a longer battery operation there has been a demand to make components have even lower power consumption. There are also similar requirements for lower power consumption operations for satellites and space communication equipment. Among these, power consumption of power amplifiers in microwave communication sections is by far the highest overall, and making these power amplifiers highly efficient is the key to achieving a longer operating time for these devices. It is known to make the microwave power amplifiers highly efficient by performing harmonic processing.

Conventionally, class F amplifiers are known as high efficiency microwave power amplifiers. With an class F amplifier a current waveform flowing in an output side of an amplifying transistor is made up of the fundamental+even harmonic components, and a voltage waveform across output terminals of the transistor is made up of the fundamental+odd harmonic components. In this way, it is possible to suppress power loss without overlapping the current waveform and the voltage waveform inside the transistor. Patent publications 1 and 2 below described a class F amplifier circuit used in a distributed constant line that is also suitable for high frequencies. Further, patent publication 2 discloses that it is possible to omit the provision of a partial stub, under fixed conditions.

However, with these techniques, it is basically necessary to provide stubs in accordance with the order of harmonics to be processed. If it is possible to further reduce the number of stubs to be provided, it becomes possible to reduce the size of a circuit and simplify a circuit much more.

On the other hand, in recent years an inverse class F amplifier has been proposed for carrying out harmonic processing that is different from the above described class F amplifiers. With an inverse class F amplifier a current waveform flowing in an output side of an amplifying transistor is made up of the fundamental+odd harmonic components, and a voltage waveform across output terminals of the transistor is made up of the fundamental+even harmonic components. In this way, it is possible to suppress power loss without overlapping the current waveform and the voltage waveform inside the transistor (refer to non-patent publication 1 below). Also, with an inverse class F amplifier, verification experiments have been performed, using an external tuner, adjusted up to the third harmonic (refer to non-patent publication 2 below). Although dependent on operating conditions, by using an inverse class F amplifier it is considered to enable higher efficiency power amplification than class F (refer to non-patent publication 3 below).

In order to obtain a voltage waveform for the above-described inverse class F operation, the load impedance at the output terminals of the amplifying transistor should be made zero for odd harmonics. Similarly, in order to obtain a current waveform, the load impedance for the even harmonics should be made infinite.

In order to realize this type of inverse class F amplifier, as shown in patent publication 3 below, for example, there is a method of connecting two reactance circuit networks that have pole and zero points set for each harmonic based on a first or second Foster method to output terminals of an amplifying transistor series and in parallel. In doing this a load impedance that alternates repeatedly between infinity and zero is realized for an increase in harmonics.

However, accompanying the move towards high frequency wireless communication of recent years, in the case of an amplifier operating at 6 GHz, for example, the frequency of the seventh harmonic becomes 42 GHz. Amplification transistors that operate in this frequency band do exist, but if the frequency of about 42 GHz is reached the self-resonant of the reactance elements becomes too great. Therefore, when the operating frequency is high, it is difficult to realize an inverse class F operation with the method of patent publication 3 below.

On the other hand, with respect to a class F amplifier, there has also been proposed a circuit for obtaining desired impedance conditions by using a distributed constant line that can also be applied to high frequencies (refer to patent publications 1 and 2 below). However, this method is specific to the class F operation, and it is not possible to obtain an inverse class F amplifier circuit even by adjusting this circuit.

Accordingly, for an inverse class F amplifier, if it is possible to provide a high frequency processing circuit that uses a distributed constant line, it will be possible to provide an inverse class F amplifier that is also capable of operating at high frequency.

Patent publication 1: Japanese unexamined patent publication No. 2001-111362

Patent Publication 2: Japanese unexamined patent publication No. 2003-234626

Patent Publication 3: Japanese unexamined patent publication No. 2005-117200

Non-patent publication 1: A. Inoue, et al., "Analysis of class-F and inverse class-F amplifiers," IEEE MTT-S Int. Microwave Symp. Dig., Boston, Mass. June 2000, pp. 775-778.

Non-patent publication 2: C. J. Wei, et al., "Analysis and experimental waveform study on inverse class-F mode of microwave power FETs," IEEE MTT-S Int. Microwave Symp. Dig., Boston, Mass. June 2000, pp. 525-528.

Non-patent publication 3: Y. Y. Woo, et al., "Analysis and experiments for high-efficiency class-F and inverse class-F power amplifiers," IEEE Trans. Microw. Theory Tech., vol. 54, no. 5, pp. 1969-1974, May 2006.

The present invention has been conceived in view of the above-described situation.

A first object of the present invention is to provide a high frequency processing circuit capable of miniaturizing a circuit, and an amplifier circuit using this high frequency processing circuit.

A second object of the present invention is, with respect to a class F or inverse class F amplifier that are known as a high efficiency power amplifier, to provide a high frequency processing circuit capable in principle of processing infinite order harmonics, and an amplifier circuit using this high frequency processing circuit.

A third object of the present invention is to provide a harmonic processing circuit for an inverse class F amplifier, capable of operating in a high frequency region such as the microwave band and the millimeter waveband, and an amplifier circuit using this harmonic processing circuit.

A fourth object of the present invention is to provide a harmonic processing circuit for an inverse class F amplifier, capable of adjusting load impedance with respect to a fundamental, without changing impedance conditions with respect to all harmonics, and an amplifier circuit using this harmonic processing circuit.

DISCLOSURE OF THE INVENTION

The present can be realized by the content of the following aspects.
(Aspect 1)
A harmonic processing circuit of a first aspect is connected between an output terminal of an amplifier and a load resistance, and processes harmonics appearing at the output terminal of the amplifier. This circuit is provided with a first impedance adjustment section and a second impedance adjustment section. The first impedance adjustment section is provided with a coupled distributed constant line. The coupled distributed constant line receive as input the output of the amplifier, and have a length of ¼ the wavelength ($\lambda$) of the fundamental of the output of the amplifier. Further, the first impedance adjusting section is configured to adjust input impedance with respect to the even harmonics to one of effectively infinity or zero. The first impedance adjusting section and the second impedance adjustment section are configured to adjust input impedance with respect to the odd harmonics to the other of effectively infinity or zero.
(Aspect 2)
The harmonic processing circuit of a second aspect is the harmonic processing circuit of the first aspect, wherein the first impedance adjusting section is configured to adjust input impedance with respect to the even harmonics to effectively infinity. Also, the first impedance adjustment section and the second impedance adjustment section are configured to adjust input impedance with respect to the odd harmonics to effectively zero. Further, the second impedance adjustment section comprises a distributed constant line for $\lambda/2$ formation that is connected to the output terminal of the coupled distributed constant line and has a length of ¼ the fundamental wavelength ($\lambda$), and a plurality of open termination distributed constant lines respectively connected in parallel to an output terminal of the distributed constant line for $\lambda/2$ formation. The plurality of open termination distributed constant lines respectively have line lengths L represented by $L=\lambda/(4\ m)$ (where $\lambda$ is the fundamental wavelength, and $m$ is a positive odd number other than 1)

(Aspect 3)
The harmonic processing circuit of a third aspect is the harmonic processing circuit of the first aspect, wherein the first impedance adjusting section is configured to adjust input impedance with respect to the even harmonics to effectively zero. Also, the first impedance adjustment section and the second impedance adjustment section are configured to adjust input impedance with respect to the odd harmonics to effectively infinity. Further, the second impedance adjustment section has a plurality of open termination distributed constant lines connected in parallel respectively to output terminals of the coupled distributed constant line. The plurality of open termination distributed constant lines respectively have line lengths L represented by $L=\lambda/(4\ m)$ (where $\lambda$ is the fundamental wavelength, and $m$ is a positive odd number other than 1).

(Aspect 4)
The harmonic processing circuit of the fourth aspect is in accordance with the second aspect, further comprising a compensating distributed constant line, connected to the output terminal of the distributed constant line for $\lambda/2$ formation, for compensating reactance components of the fundamental at the output terminal of the amplifier.
(Aspect 5)
The harmonic processing circuit of the fifth aspect is in accordance with the second aspect, further comprising a reactance element, connected to the output terminal of the distributed constant line for $\lambda/2$ formation, for compensating reactance components of the fundamental at the output terminal of the amplifier.
(Aspect 6)
With an amplifier circuit of the sixth aspect, an input terminal of the distributed constant line of the harmonic processing circuit of any one of the first to fifth aspects is connected to an output terminal of the amplifier.
(Aspect 7)
In the amplifier circuit of the seventh aspect, an amplifying transistor is used as the amplifier in the sixth aspect.
(Aspect 8)
In the amplifier circuit of the eighth aspect, a negative resistance two-terminal amplification element is used as the amplifier in the sixth aspect.

According to the invention of aspect 1, since it is possible to process even number harmonics using coupled distributed constant line, it is not necessary to provide an individual stub for processing the even harmonics. According to this invention, therefore, it becomes possible to reduce the size of a class F or inverse class F harmonic processing circuit.

In the invention of aspect 2, by providing open termination distributed constant lines for processing $m^{th}$ order harmonics (where m is a positive odd number other than 1), it is possible to process an $m^{th}$ order harmonic. Accordingly, with this invention it is possible to provide a high frequency processing circuit capable of theoretically processing infinite order harmonics, in an inverse class F amplifier, being a high efficiency power amplifier. Also, according to this invention, it is possible to provide a harmonic processing circuit for an inverse class F amplifier that is capable of operation in a high frequency band such as the microwave band or the millimeter wave band. Further, according to this invention it is possible to provide a harmonic processing circuit for an inverse class F amplifier, capable of adjusting load impedance with respect to a fundamental, without destroying impedance conditions with respect to all harmonics.

According to the invention of aspect 3, by providing open termination distributed constant lines for processing $m^{th}$ order harmonics (where m is a positive odd number other than 1), it is possible to process an $m^{th}$ order harmonic. Accordingly, with this invention it is possible to provide a high frequency processing circuit capable of theoretically processing infinite order harmonics, in a class F amplifier, which is known as a high efficiency power amplifier.

According to the invention of aspect 4 and aspect 5, it is possible to adjust a reactive component of a load impedance with respect to a fundamental (for example, 1.9 GHz), without affecting the characteristics of harmonics.

According to the invention of aspect 6, it is possible to expect reduction in size of a class F or inverse class F amplifier circuit.

BRIEF DESCRIPTION OF THE DRAWINGS

In FIG. 4, the vertical axes represent a current characteristics (mA) and a voltage characteristic (V) for a drain current terminal.

In FIG. 9, the vertical axes represent a current characteristic (mA) and a voltage characteristic (V) for a drain current terminal.

Figure 1:
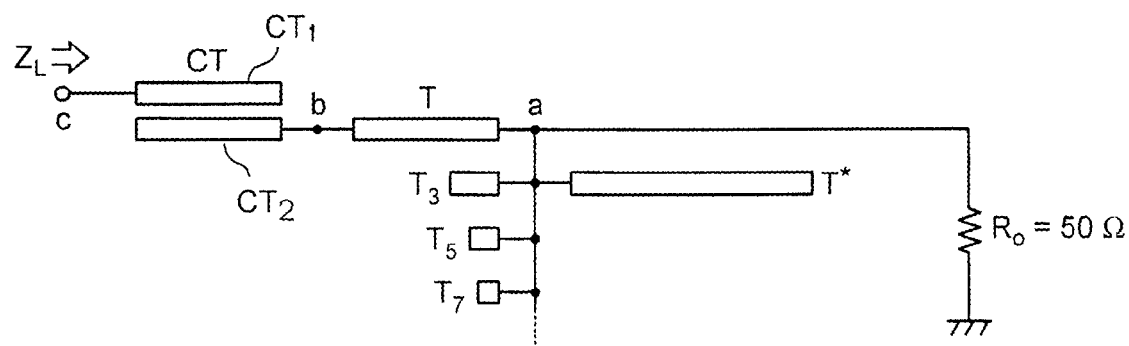
FIG. 1 is drawing showing a harmonic processing circuit of a first embodiment of the present invention.

BEST MODE FOR CARRYING OUT THE INVENTION (Structure of First Embodiment: Inverse Class F)

A harmonic processing circuit (load circuit) of a first embodiment of the present invention will be described with reference to on FIG. 1 to FIG. 5. First, the structure of this load circuit will be described based on FIG. 1. This load circuit is connected between an output terminal of an amplification transistor (described later) and a load resistance $R_0$. This load circuit comprises, as main structural elements, a coupled distributed constant line CT, an distributed constant line T for $\lambda/2$ formation, a plurality of open termination distributed constant lines T3-Tn, and an open termination distributed constant line T* for reactance compensation.

An input terminal c of the coupled distributed constant line CT is connected to an output terminal of an amplification transistor. The coupled distributed constant line CT has a length of ¼ the wavelength ($\lambda$) of the fundamental of the output of the amplification transistor. Specifically, the coupled distributed constant line CT of this embodiment is made up of two parallel distributed constant lines CT1 and CT2, with the two distributed constant lines having a length of $\lambda/4$.

An input side of the distributed constant line T for $\lambda/2$ formation is connected to an output terminal b of the coupled distributed constant line CT. The output side of the distributed constant line T is connected in series with the load resistance R0 (in this example, 50Ω). The length of the distributed constant line T is the same as the coupled distributed constant line CT (that is, $\lambda/4$). In this way, a length obtained by combining the coupled distributed constant line CT and the distributed constant line T becomes $\lambda/2$.

The plurality of open termination distributed constant lines $T_3$-$T_n$ (in the drawing $T_7$) are connected in parallel with each other, and to the output terminal a of the distributed constant line T. Here, n is a positive odd number other than 1. The respective line lengths L of these open termination distributed constant lines $T_3$-$T_n$ (generally shown as $T_m$) are defined as:

$$L=\lambda/(4\,m) \text{ (that is, } m=3, 5, 7, \ldots, n\text{)}$$

Further, with this embodiment the plurality of open termination distributed constant lines $T_3$-$T_n$ are not all provided continuously. Specifically, with this embodiment among "open termination distributed constant lines $T_3$-$T_n$ having a line length corresponding to m, represented by m=pk (where p and k are positive odd numbers other than 1)" the provision of some or all of them is omitted. Here, "omitted" means they are not provided. For example, in the case where p=3 and k=3. $T_9$ can be omitted. Also, k is taken to mean the k of $T_k$ that is actually provided. Accordingly, this means that in the case where $T_3$ is provided, then if p=3, $T_9$ can be omitted. p can be set arbitrarily as long as the previously described conditions are satisfied. Regarding this omission, patent publication 2 also discloses a similar way of thinking. However, this embodiment differs from the technique of patent publication 2 in that it is basically possible to completely do away with the lines for even harmonics. It is possible to actually install the open termination distributed constant line that can be omitted in principal (for example, the previously described line $T_9$). Specifically, actually omitting a line that can be omitted is not essential.

Figure 2:
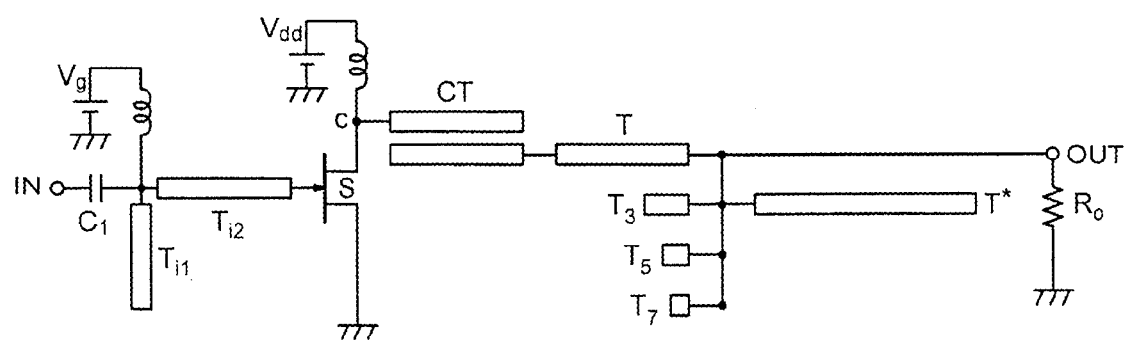
FIG. 2 is a drawing showing an inverse F class amplifier circuit that uses the harmonic processing circuit of FIG. 1.

Next, an amplifier circuit that uses the load circuit of this embodiment will be described based on FIG. 2. With this example, an input terminal c of a coupled distributed constant line CT is connected to an output terminal of an amplification transistor S. Also, a coupling capacitor C1 for direct current blocking is connected immediately after a signal input terminal IN. Power supply voltages Vg and Vdd are also supplied to the transistor S. In FIG. 2, reference numerals $T_{i1}$ and $T_{i2}$ represent distributed constant lines for input matching.

(Operation of the First Embodiment)

Next, a description will be given of the operation (inverse class F operation) of the load circuit of this embodiment.

First, standing waves are set-up with the coupled distributed constant line CT having a length of $\lambda/4$ with respect to the fundamental, so that in the case where both ends are open terminations there is an open state with respect to even harmonics at both input and output connection sections, while for odd harmonics there is a short circuit state. At this time there is no coupling for even harmonics, having the same standing wave distribution within both lines, due to the fact that there is no voltage difference between lines. Therefore, looking from the input it becomes simply a $\lambda/4$ open termination distributed constant line, and when the load side is viewed from the transistor output terminal side it becomes a substantially infinite load impedance with respect to the even harmonics. Here "substantially" has the meaning of "to the extent necessary for circuit operation". The same is true hereafter.

On the other hand, there is strong coupling for odd harmonics for which standing wave distribution within the two lines is reversed, and there is transfer from the input to the output in accordance with the characteristic impedance of the lines. At this time, the coupled distributed constant line CT act as a single distributed constant line having a length of $\lambda/4$ with respect to the fundamental.

A distributed constant line T having a length of $\lambda/4$ at the fundamental, and connected to an output side of the coupled distributed constant line CT, can be considered collectively with the coupled distributed constant line CT as a distributed constant line having a length of $\lambda/2$. At this time, a short circuit state is achieved with respect to odd harmonics at the output point of the distributed constant line T, as a result of the plurality of open termination distributed constant lines $T_3$-$T_n$ having lengths of $\lambda/4$ with respect to wavelength $\lambda$ of respective odd harmonics, and being connected to the output side of the distributed constant line T. Accordingly, there is substantially zero load impedance with respect to odd harmonics when the load side is viewed from the transistor output side. Detailed operation of the circuit of this embodiment will be described later.

With the circuit of this embodiment, since it is possible to process even number harmonics using the coupled distributed constant line CT, it is not necessary to provide an individual stub for processing the even harmonics. According to this invention, therefore, it becomes possible to reduce the size of a class F or inverse class F harmonic processing circuit.

With the circuit of this embodiment, by providing open termination distributed constant lines $T_m$ for processing $m^{th}$ order harmonics (where m is a positive odd number other than 1), it is possible to process an $m^{th}$ order harmonic. Accordingly, with this circuit it is possible to provide a high frequency processing circuit capable of theoretically processing infinite order harmonics, in an inverse class F amplifier, being a high efficiency power amplifier. However, as will be understood, in actual fact it is possible to provide only up to open termination distributed constant line $T_m$ according to the harmonics that require processing. That is, up to what number open termination distributed constant line $T_m$ is actually provided is determined according to the highest order harmonic that requires harmonic processing. According to this embodiment, even if a harmonic that requires processing is high, there is the advantage that it is theoretically possible to handle it.

Also, according to this circuit, since it is not necessary to use the reactance circuit network such as is disclosed in patent publication 3 above, it is possible to provide a harmonic processing circuit for an inverse class F amplifier, that is capable of operating in a high frequency region, such as the microwave band and millimeter wave band.

Also, by connecting open termination distributed constant lines T* for reactance compensation to the output side of the distributed constant line T, it is possible to adjust a reactance component of a load impedance with respect to a fundamental (for example, 1.9 GHz), without affecting the characteristics of harmonics. It is also possible to optimize the load impedance by adjusting characteristic impedances of the coupled distributed constant line CT and the distributed constant line T collectively. Specifically, according to this circuit it is possible to provide a harmonic processing circuit for an inverse class F amplifier, capable of adjusting load impedance with respect to a fundamental, without destroying impedance conditions with respect to all harmonics.

Figure 3:
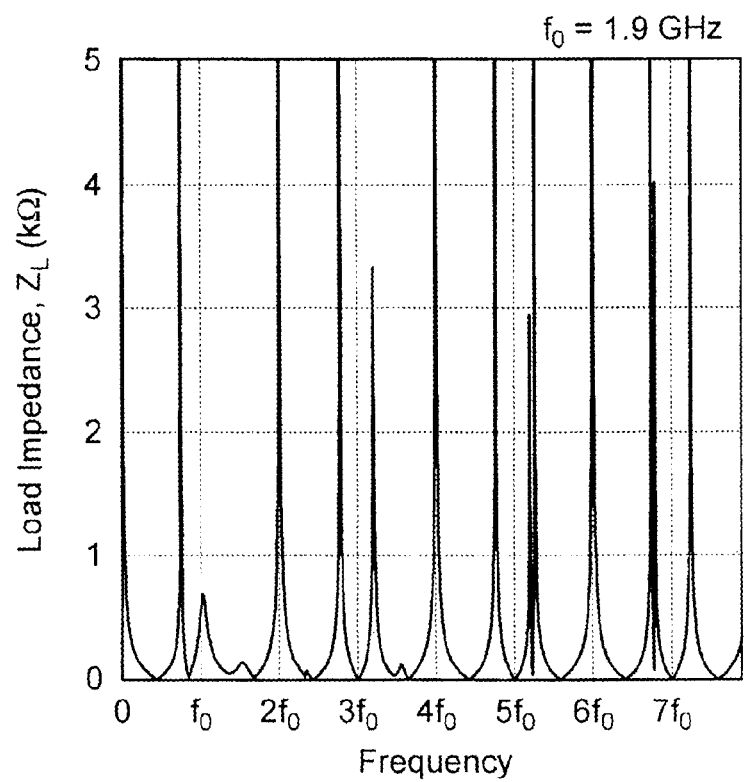
FIG. 3 is a graph showing a load impedance characteristic of a the harmonic processing circuit of FIG. 1

A load impedance characteristic of a load circuit of this embodiment is shown in FIG. 3. The load impedance is extremely large with respect to even harmonics (specifically the impedance becomes substantially infinity), and zero for odd harmonics. With the circuit of this embodiment, therefore, it is possible to perform an inverse class F amplifier operation. The characteristic shown in FIG. 3 was obtained by calculation, and the parameters for this calculation were as follows.

Figure 4:
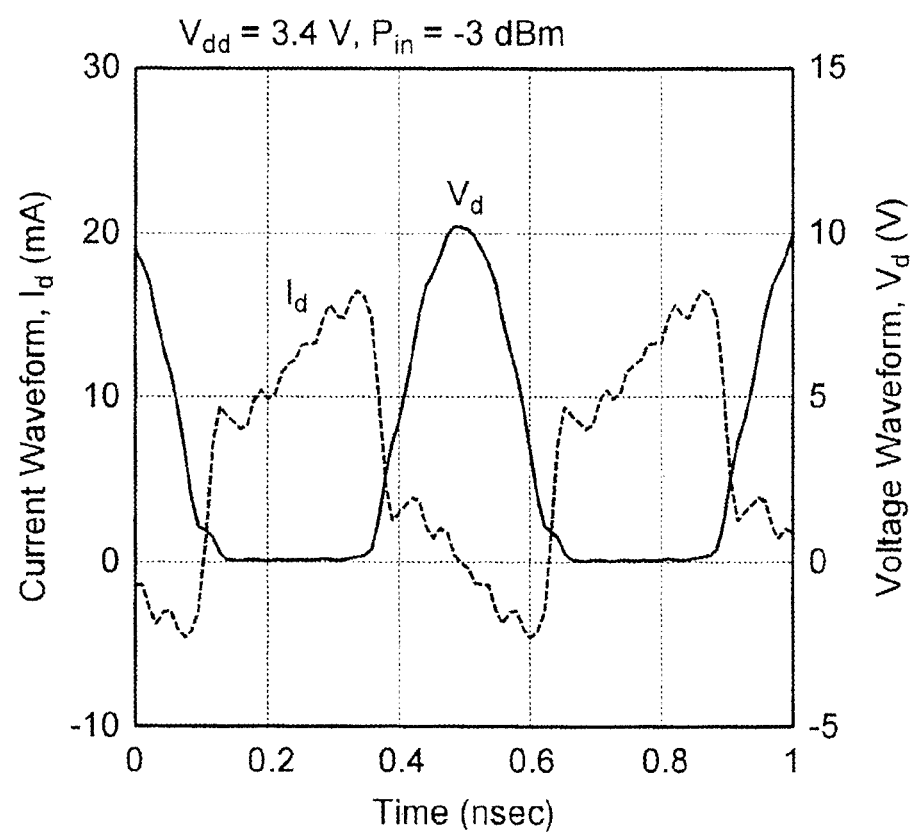
FIG. 4 is a graph showing a characteristic for an amplifier circuit that uses the harmonic processing circuit of FIG. 1.
Figure 5:
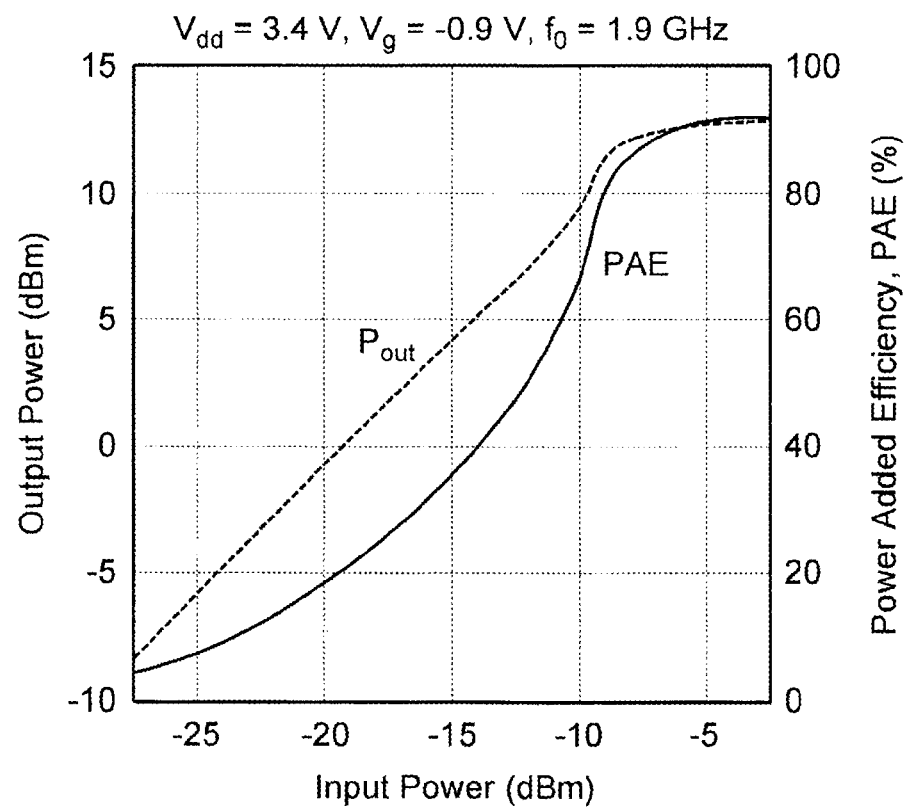
FIG. 5 is a graph showing output power (dBm) and power applied efficiency (PAE(%)) for the inverse F class operation shown in FIG. 4.

(Calculation Parameters)
  coupled distributed constant line CT
    balanced mode characteristic impedance: 252 $\Omega$
    unbalanced mode characteristic impedance: 32 $\Omega$
  distributed constant line T
    characteristic impedance: 30 $\Omega$
  odd harmonic processing/open termination distributed constant lines
    characteristic impedance: 50 $\Omega$
  fundamental reactance adjustment/open termination distributed constant line
    characteristic impedance: 50 $\Omega$
    electrical length (with respect to fundamental): 120°
  load resistance: 50 $\Omega$ The load circuit of this embodiment was applied to a amplification transistor S having the following parameters. Parameters were as follows.
  saturated drain current: 60 mA.
  threshold voltage: −0.9V
  power supply voltage: 3.4 V
  maximum oscillation frequency fmax: 70 GHz
  composition: heterojunction FET A voltage/current characteristic for a drain current terminal in this case, was calculated using a harmonic balance simulator. The results are shown in FIG. 4. There was virtually no overlapping of instantaneous voltage and instantaneous current, and an operation close to textbook inverse class F operation was realized. Power-Added Efficiency (PAE) at this time is shown in FIG. 5. From FIG. 5 it will be understood that PAE exceeds 90%. In FIG. 5, $P_{out}$ represents output power available in the load resistance.

With the first embodiment, as will be clear from the above description of the operation, the coupled distributed constant line CT constitute a first impedance adjustment section for adjusting input impedance with respect to even harmonics to substantially infinity.

Also in the first embodiment, the λ/2 formation distributed constant line T and the plurality of open termination distributed constant lines $T_m$ constitute a second impedance adjustment section for adjusting the input impedance with respect to odd harmonics to substantially zero. As will be clear from the above description of the operation, the coupled distributed constant line CT constituting the first impedance adjustment section is also useful in exhibiting a function of adjusting input impedance with respect to odd harmonics to substantially zero. Accordingly, with the first embodiment adjustment for odd harmonics is achieved using the first impedance adjustment section and the second impedance adjustment section.

(Structure of Second Embodiment: Class F)

Next, a harmonic processing circuit (load circuit) of a second embodiment of the present invention will be described with reference to on FIG. 6 to FIG. 10. In the description of this embodiment, elements that are basically common to structural elements of the first embodiment described above use the same reference numerals, so that description can be simplified.

Figure 6:
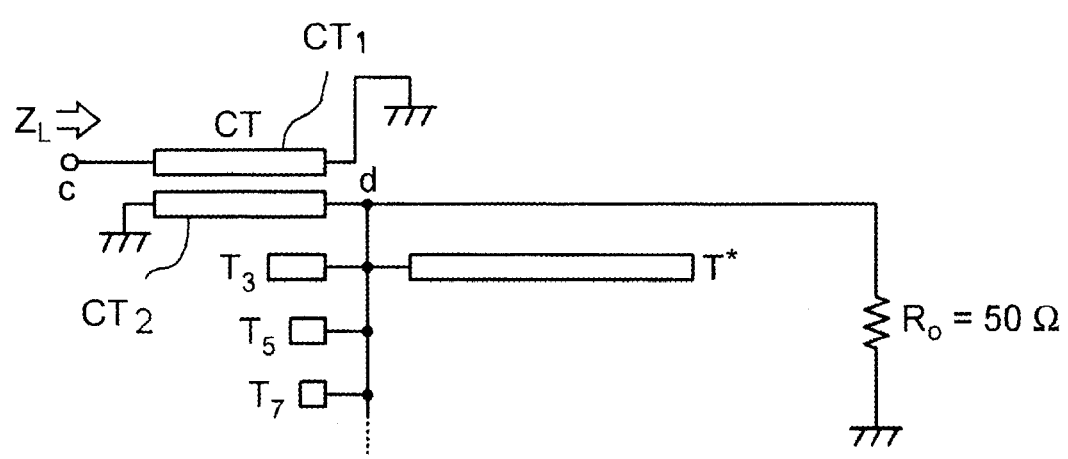
FIG. 6 is drawing showing a harmonic processing circuit of a second embodiment of the present invention.

First, the structure of this load circuit will be described based on FIG. 6. This load circuit is connected between an output terminal of an amplification transistor (described later) and a load resistance $R_0$. This load circuit comprises, as main structural elements, a coupled distributed constant line CT, a plurality of open termination distributed constant lines $T_3$-$T_n$, and an open termination distributed constant line T* for reactance compensation.

An input terminal c of the coupled distributed constant line CT is connected to an output terminal of an amplification transistor. The coupled distributed constant line CT has a length of ¼ the wavelength (λ) of the fundamental of the output of the amplification transistor. This structure is the same as in the first embodiment. However, with the second embodiment distributed constant lines CT1 and CT2 constituting the coupled distributed constant line CT are respectively short-circuit terminated (refer to FIG. 6).

The plurality of open termination distributed constant lines $T_3$-$T_n$ (in the drawing up to $T_7$) are connected in parallel with each other, and to the output terminal d of the coupled distributed constant line CT. Here, n is a positive odd number other than 1. The respective lengths L of these open termination distributed constant lines $T_3$-$T_n$ (generally shown as $T_m$) are defined as:

$$L=\lambda/(4\ m)\ (\text{that is, } m=3, 5, 7, \ldots, n)$$

Further, with this embodiment the plurality of open termination distributed constant lines $T_3$-$T_n$ are not all provided continuously. Specifically, with this embodiment among "open termination distributed constant lines $T_3$-$T_n$ having a line length corresponding to m, represented by m=pk (where p and k are positive odd numbers other than 1)" the provision of some or all of them is omitted. Here, "omitted" means they are not provided. For example, in the case where p=3 and k=3. $T_9$ can be omitted. Also, k is taken to mean the k of $T_k$ that is actually provided. Accordingly, this means that in the case where $T_3$ is provided, then if p=3, $T_9$ can be omitted. p is can be arbitrarily selected as long as the following conditions are satisfied. Regarding this omission, patent publication 2 also discloses a similar way of thinking. However, this embodiment differs from the technique of patent publication 2 in that it is basically possible to completely do away with the lines for even harmonics. It is possible to actually install the open termination distributed constant line that can be omitted in principal (for example, the previously described line $T_9$). Specifically, actually omitting the line that can be omitted is not essential.

Figure 7:
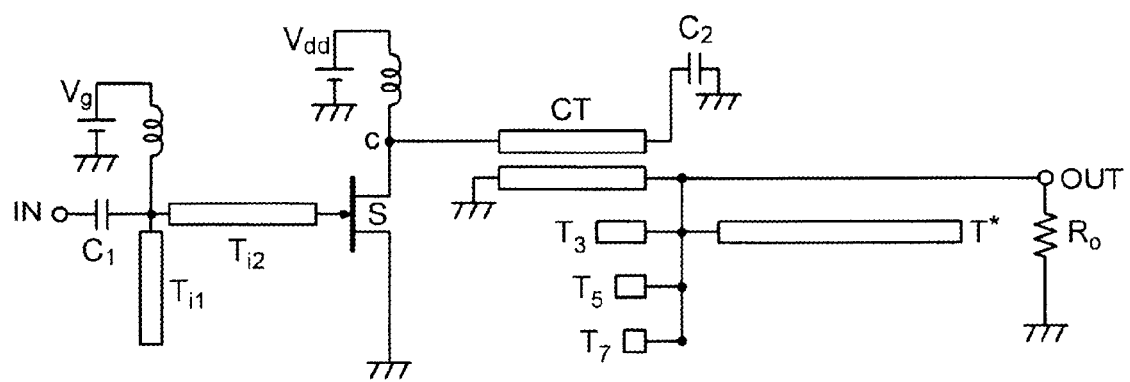
FIG. 7 is a drawing showing an inverse F class amplifier circuit that uses the harmonic processing circuit of FIG. 6.

Next, an amplifier circuit that uses the load circuit of this embodiment will be described based on FIG. 7. With this example, an input terminal c of a coupled distributed constant line CT is connected to an output terminal of an amplification transistor S. Also, a coupling capacitor C1 for direct current blocking is connected immediately after a signal input terminal IN. Also, a coupling capacitor C2 for direct current blocking is connected to a terminating side of the distributed constant line CT1 at the input side of the coupled distributed constant line CT. Power supply voltages Vg and Vdd are also supplied to the transistor S. In FIG. 7, reference numerals $T_{i1}$ and $T_{i2}$ represent input matching distributed constant lines.

(Operation of the Second Embodiment)

Next, a description will be given of the operation (class F operation) of the load circuit of this embodiment.

First, standing waves are set-up with the coupled distributed constant line CT having a length of λ/4 with respect to the fundamental, so that in the case that both ends are short-circuit terminations there is a short-circuit state with respect to even harmonics at both input and output connection sections, while for odd harmonics there is an open state. At this time there is no coupling for even harmonics, having the same standing wave distribution within both lines, due to the fact that there is no voltage difference between lines. Therefore, looking from the input it becomes simply a λ/4 short-circuit termination distributed constant line, and when the load side is viewed from the transistor output terminal side it becomes a substantially zero load impedance with respect to the even harmonics.

On the other hand, there is strong coupling for odd harmonics for which standing wave distribution within the two lines is reversed, and there is transfer from the input to the output in accordance with the characteristic impedance of the lines. At this time, the coupled distributed constant line CT operate in the same way as a distributed constant line having a length of λ/4 with respect to the fundamental.

At this time, because of the plurality of open termination distributed constant lines $T_3$-$T_n$ having lengths of λ/4 with respect to the wavelengths Λ of the respective odd harmonics, connected to the output side of the coupled distributed constant line CT, there is a short-circuit state with respect to odd harmonics at the output point of the coupled distributed constant line CT. Accordingly, there is substantially infinite load impedance with respect to odd harmonics when the load side is viewed from the transistor output side.

With the circuit of this embodiment, since it is possible to process even number harmonics using the coupled distributed constant line CT, it is not necessary to provide an individual stub for processing the even harmonics. According to this circuit, therefore, it becomes possible to reduce the size of a class F harmonic processing circuit.

With the circuit of this embodiment, by providing open termination distributed constant lines Tm for processing $m^{th}$ order harmonics (where m is a positive odd number other than 1), it is possible to process an $m^{th}$ order harmonic. Accordingly, with this circuit it is possible to provide a high frequency processing circuit capable of theoretically processing infinite order harmonics, in class F amplifier, being a high efficiency power amplifier. However, as will be understood, in actual fact it is possible to provide only up to open termination distributed constant line $T_m$ according to the harmonics that require processing. That is, up to what number open termination distributed constant line $T_m$ is actually provided is determined according the highest order harmonic that requires harmonic processing. According to this embodiment, even if a harmonic that requires processing is high, there is the advantage that it is theoretically possible to handle it.

Also, by connecting open termination distributed constant lines T* for reactance compensation to the output side of the distributed constant line T, it is possible to adjust a reactance component of a load impedance with respect to a fundamental (for example, 1.9 GHz), without affecting the characteristics of harmonics. It is also possible to optimize the load impedance by adjusting characteristic impedances of the coupled distributed constant line CT and the distributed constant line T collectively.

Figure 8:
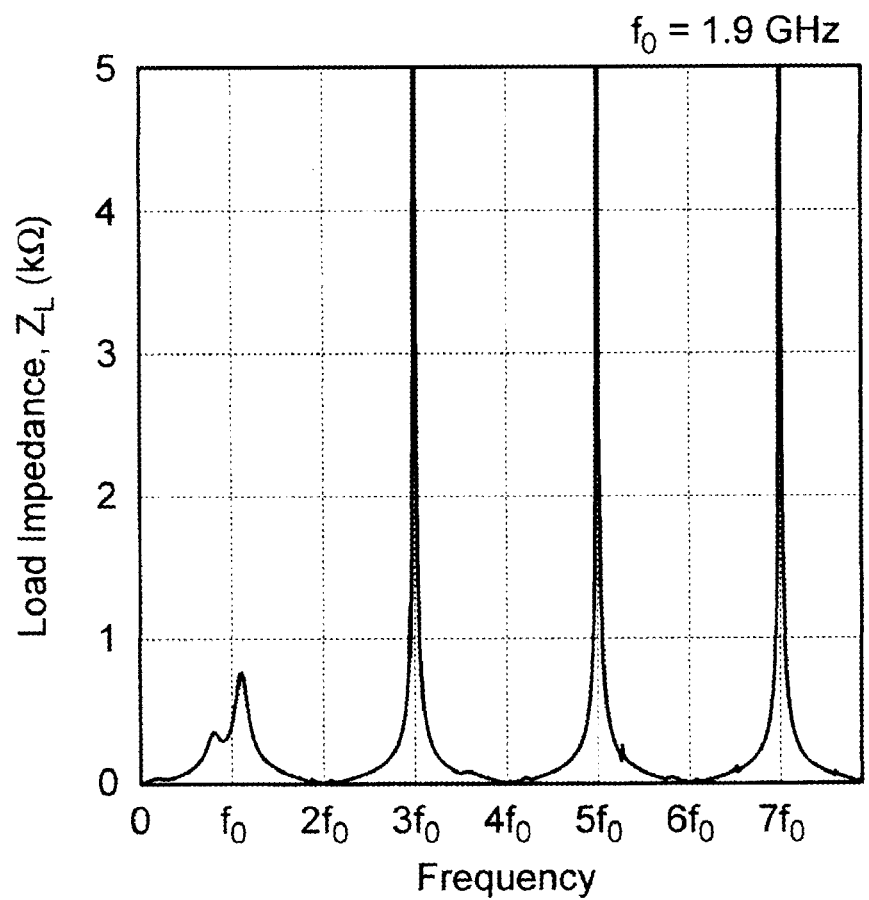
FIG. 8 is a graph showing a load impedance characteristic of a the harmonic processing circuit of FIG. 6.

A load impedance characteristic of a load circuit of this embodiment is shown in FIG. 8. The load impedance is extremely large with respect to odd harmonics, and zero for even harmonics. With the circuit of this embodiment, therefore, it is possible to perform a class F operation.

The characteristic shown in FIG. 8 was obtained by calculation, and the parameters for this calculation were as follows.
(Calculation Parameters)
    coupled distributed constant line CT
        balanced mode characteristic impedance: 252 Ω
        unbalanced mode characteristic impedance: 53 Ω
    odd harmonic processing/open termination distributed constant lines
        characteristic impedance: 50 Ω
    fundamental reactance adjustment/open termination distributed constant line
        characteristic impedance: 50 Ω
        electrical length (with respect to fundamental): 153°
    load resistance: 50 Ω

Figure 9:
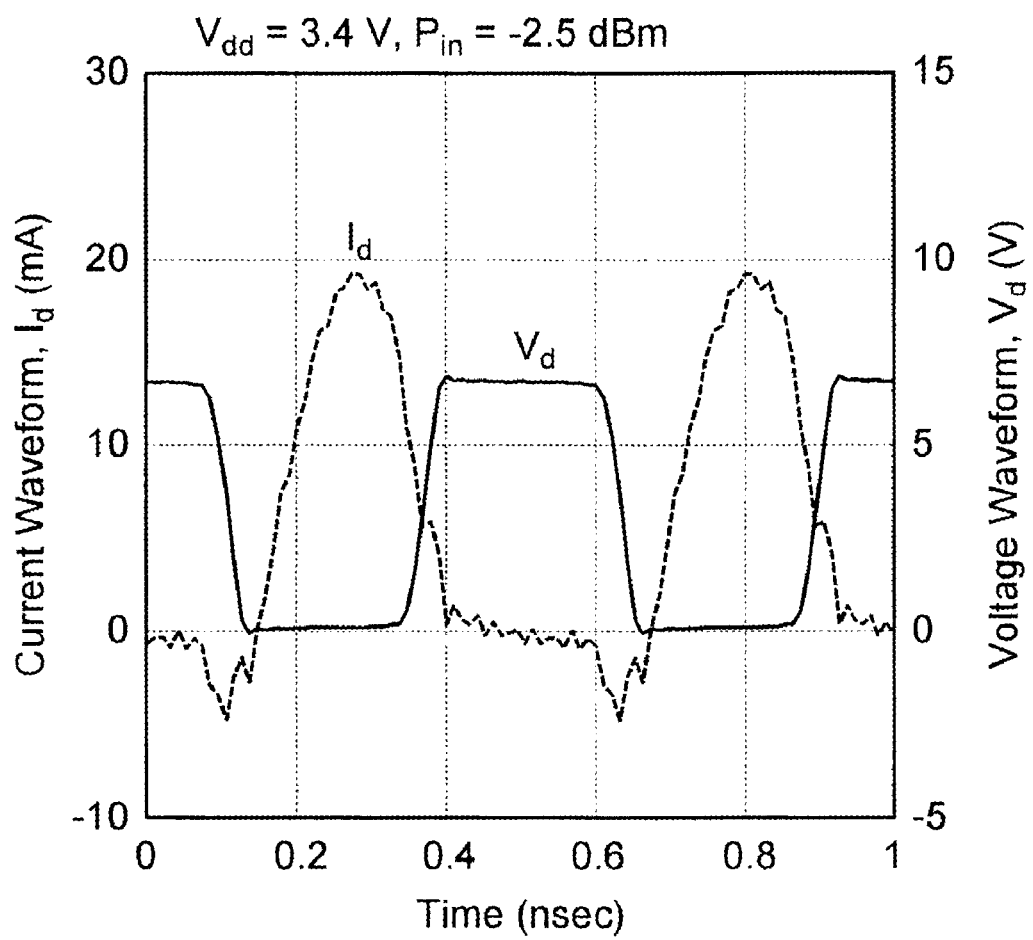
FIG. 9 is a graph showing a characteristic for an amplifier circuit that uses the harmonic processing circuit of FIG. 6.
Figure 10:
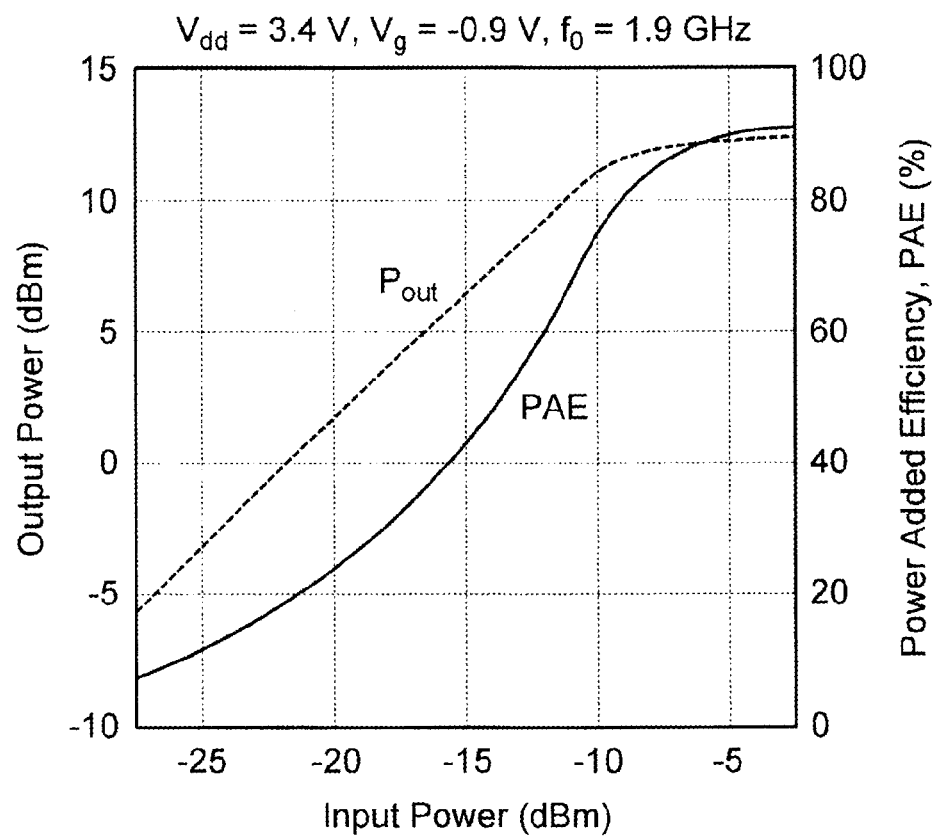
FIG. 10 is a graph showing output power (dBm) and power applied efficiency (PAE) for the F class operation shown in FIG. 9.

The load circuit of this embodiment was applied to a amplification transistor S having the following parameters. Parameters were as follows:
    saturated drain current: 60 mA.
    threshold voltage: −0.9V
    power supply voltage: 3.4 V
    maximum oscillation frequency fmax: 70 GHz
    composition: heterojunction FET A voltage/current characteristic for a drain current terminal in this case, was calculated using a harmonic balance simulator. The results are shown in FIG. 9. There was virtually no overlapping of instantaneous voltage and instantaneous current, and an operation close to textbook class F operation was realized. Power-added Efficiency (PAE) at this time is shown in FIG. 10. From FIG. 10 it will be understood that PAE exceeds 90%. In FIG. 10, $P_{out}$ represents output power available in the load resistance.

With the second embodiment, as will be clear from the above description of the operation, the coupled distributed constant line CT constitute a first impedance adjustment section for adjusting input impedance with respect to even harmonics to substantially zero.

Also, in the second embodiment, the plurality of open termination distributed constant lines Tm constitute a second impedance adjustment section. With this embodiment, as described previously, the first impedance adjustment section and the second impedance adjustment section exhibit a function of adjusting input impedance with respect to the odd harmonics to effectively infinity.

Incidentally, disclosure of each above-described embodiment is only a single example, and does not show essential structure in the present invention. The structure of each section of the embodiment is not limited to that described above as long as it is possible to achieve the object of the present invention. For example, with each of the embodiments described above, a transistor has been used as the amplifier, but instead it is also possible to use a negative resistance two-terminal amplification element. As examples of this type of element, there are an IMPATT diode, a Gunn diode or a resonant tunneling diode, etc. In each of the above-described embodiments, a single amplifier element (for example, a transistor or a negative resistance two-terminal amplifier element) has been used as one example of an amplifier, but it is also considered possible to use an amplifier constructed using this circuit.

Also, with each of the above described embodiments, the structures is provided with compensating distributed constant lines T* for compensating a reactance component, but instead of this it is also possible to provide a reactance element (not shown) for compensating a reactance component of the fundamental at the output terminal c of the amplifier S.

The device of the present invention is not limited to each of the above described embodiments, and it is possible to add various modifications within the scope without departing from the gist of the present invention.
(Supplementary Description of Operation Principle)

In the following there is provided a supplementary description of the operating principles of the circuits of each of the embodiments described above.
(Operating Principles for F Class Amplifier and Inverse F Class Amplifier)

With an F class amplifier that is one of power amplifiers, current and voltage waveforms within a transistor (amplifier) are adjusted by appropriately processing harmonics of twice, three times . . . etc., to realize high efficiency operation. Specifically, by connecting a load, that constitutes a short-circuit to even harmonics and an open circuit to even harmonics, to an output terminal of an amplification transistor, a current waveform flowing internally from an output side of the transistor becomes a half-wave rectified waveform, and voltage across the output terminal of the transistor becomes a square-wave waveform (refer to FIG. 11a).

In this case, since there is no overlapping of the current waveform and the voltage waveform, there is no power consumption inside the transistor, resulting in high efficiency operation. On the other hand, if open circuit and short circuit are switched in this harmonic processing, the relationship between the current waveform and the voltage waveform is reversed, but in this case also there is no overlapping of the waveforms, and so the same high efficiency operation can be achieved (FIG. 11b). An amplifier using this approach is called an inverse F class amplifier. Whatever approach is adopted, in theory a 100% efficiency (collector efficiency, drain efficiency) can be achieved.

Figure 12:
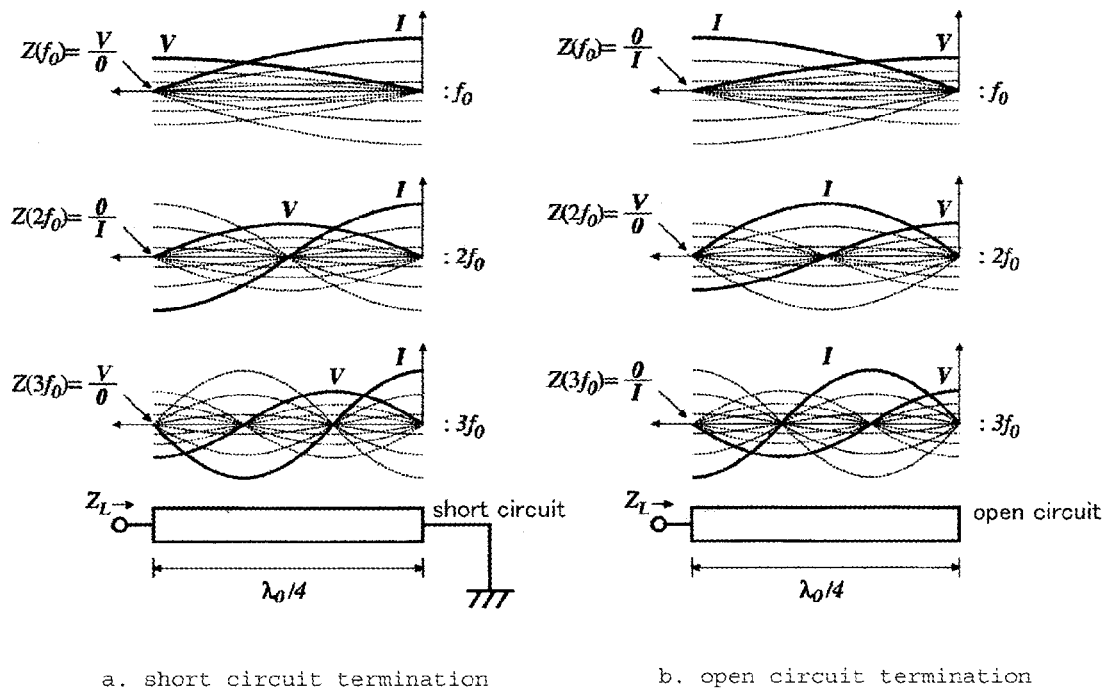
FIG. 12 is an explanatory drawing showing appearance of standing waves for the fundamental, double the frequency, and three times the frequency, when a termination of the distributed constant line having a length of ¼ the wavelength of the fundamental is made open circuit or short circuit, with FIG. 12(a) being for the case where the termination of the distributed constant line is short circuit, and FIG. 12(b) the case for when the termination is open circuit.
Figure 13:
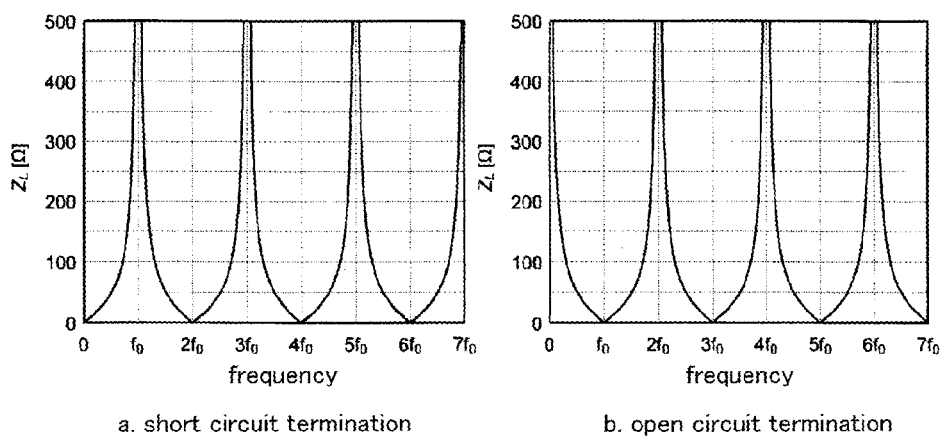
FIG. 13 is a graph showing an impedance-frequency characteristic for an input end of each line shown in FIG. 12(a) and FIG. 12(b).

A method of realizing this type of high efficiency processing with distributed constant lines will be described. First, an end (the right side in FIG. 12) of a distributed constant line having a length of ¼ with respect to the wavelength of a fundamental frequency will be considered for the case of short circuit or open circuit (refer to FIG. 12). In FIG. 12, the appearance of standing waves for the fundamental, two times the frequency, and three times the frequency are shown together. In the case where the termination is made short circuit (refer to FIG. 12(a)), with respect to the fundamental, at the input terminal a current standing wave is zero, and a voltage standing wave is maximum, and impedance becomes infinity. With respect to twice the frequency, conversely the voltage standing wave is zero and the current standing wave is maximum, and so impedance is zero. At three times the frequency and above, these two waveform relationships repeat alternately. The case of an open termination (refer to FIG. 12(b)) has the inverse characteristic. A computational example of the impedance-frequency characteristic at the input terminal is shown in FIG. 13. From the drawing it will be understood that for harmonics of twice or more the frequency, then for a short circuit termination (refer to FIG. 13a) load conditions for class F are satisfied, while for an open termination (refer to FIG. 13b) load conditions for inverse F class are satisfied. That is, if it is possible to realize a short circuit, or open circuit, only for harmonics of twice the frequency or more, then in principle it will be possible to realize an F class or inverse F class amplifier capable of processing up to an arbitrary harmonic.

With existing F class harmonic processing circuits (refer to FIG. 14), in order to short circuit each harmonic at a terminating section of FIG. 12 of a distributed constant line having a length of $\lambda_0/4$, only a number of open termination distributed constant lines constituting ¼ wavelength for each of the harmonics are connected (while some can be omitted). This $\lambda_0$ is the wavelength of the fundamental, while $\lambda_m$ is the wavelength of the $m_{th}$ harmonic. Lines for retrieving the output fundamental are also connected to the same points. At this time, impedance at the terminations becomes a value of the parallel combination of the respective impedances. With parallel circuits, if the impedance of any one of the lines is zero, then the combined impedance becomes zero, and therefore a short circuit state at an arbitrary harmonic frequency caused by a distributed constant line for short circuiting at that harmonic is not affected by the impedance values of other lines, and zero impedance is held.

On the other hand, with inverse class F, as shown in FIG. 12(b), it is necessary to make the termination sections of the distributed constant lines open circuit. However, in the case of considering a structure that is the same as class F, even if respective distributed constant lines that are open with respect to each harmonic are connected to termination sections, the open impedance is affected by the impedance of other lines, and so desired load conditions cannot be obtained. Also, the fact that impedances of the distributed constant lines are connected in series is impossible from a structural point of view. Therefore, in order to realize an inverse class F load state, it is necessary to consider a circuit structure that is different to that for class F.

(Operating Principle Of Harmonic Processing Circuit Using Coupled Distributed Constant Line)

With the harmonic processing circuits of each of the above-described embodiments, a coupled distributed constant transmission line was newly provided. This is advantageous in cases where two distributed constant lines that are adjacent and parallel are electrically coupled, and for balanced mode transmission lines and band pass filters etc.

Figure 15:
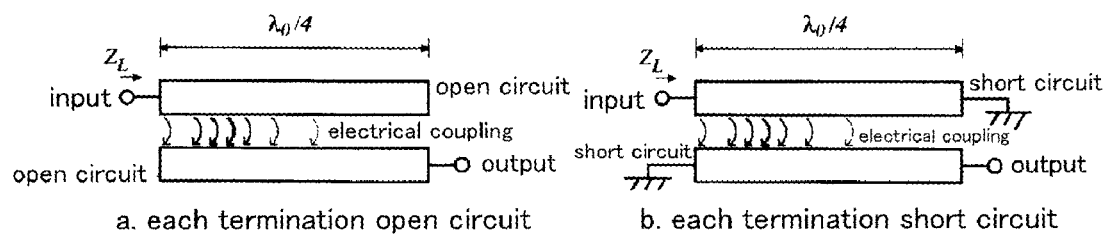
FIG. 15 is a schematic drawing of a coupled distributed constant line.

FIG. 15 shows a schematic diagram of a coupled distributed constant transmission line in a case where one end of one line is made the input and the opposite end of the other line is made the output. Each line has a length of ¼ the fundamental wavelength $\lambda_0$. Also, the drawing shows two cases, where the ends (terminations) of the receptive distributed constant lines that have no terminals are made either open circuit (FIG. 15a) or short circuit (FIG. 15b).

Figure 16:
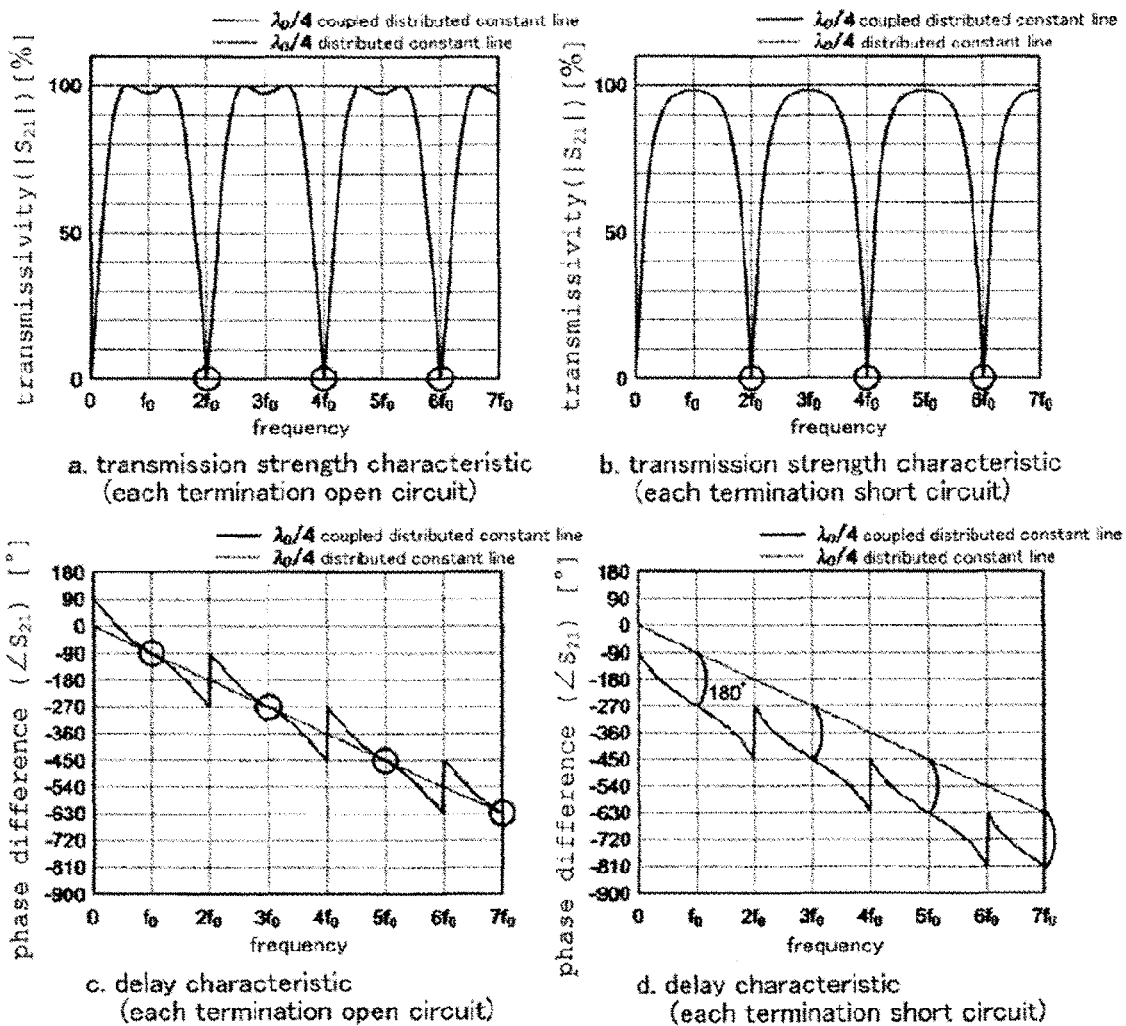
FIG. 16 is a graph showing a transmission characteristic of the coupled distributed constant line shown in FIG. 15.

FIG. 16 shows a computational example of a transmission characteristic for the coupled distributed constant line shown in FIG. 16 (solid lines in the drawing). A computational example for a distributed constant line having a length of ¼ the fundamental is also shown for comparison (dotted lines in the drawing). From the transmission strength characteristics of FIGS. 16a and 16b, it will be understood that transmission of both coupled distributed constant lines with respect to even harmonics of twice or four times . . . the fundamental is zero. This indicates that with even harmonics no coupling occurs, and that all energy returns to the input side due to total reflection at each termination. On the other hand, in the transmission characteristics of FIG. 16c and FIG. 16d, if odd harmonics of three time, 5 times . . . and also including the fundamental, are noted, then the case of FIG. 16c has the same phase difference as a comparable distributed constant line, and the case of FIG. 16d is delayed by 180° from the values of a comparable distributed constant line. This delay characteristic constitutes an important characteristic of harmonic processing, which will be described later.

Figure 17:
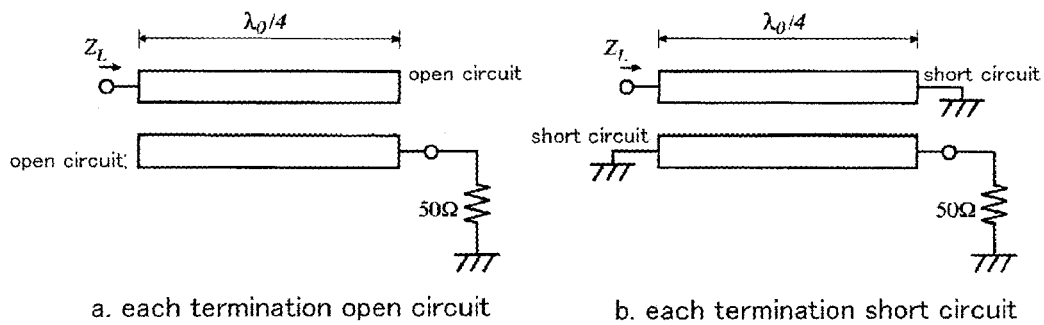
FIG. 17 is a circuit diagram showing a coupled distributed constant line having an output side terminated by a load resistance of 50 Ω.
Figure 18:
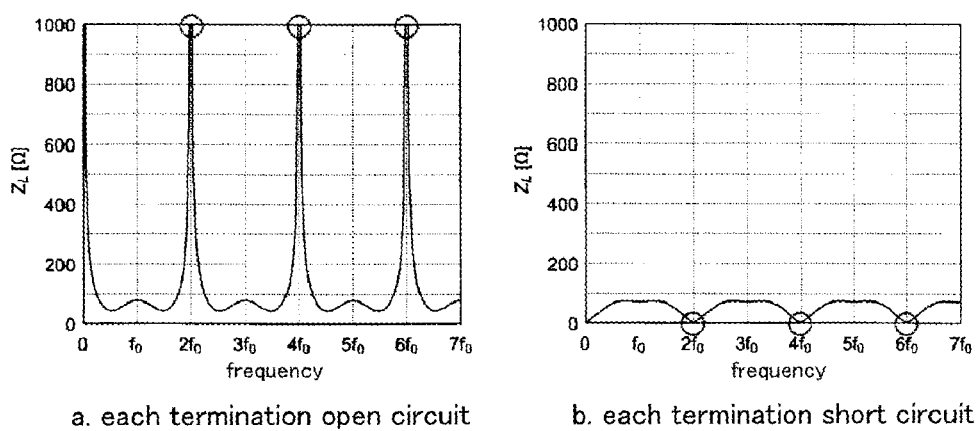
FIG. 18 is a graph showing an input impedance frequency characteristic of the coupled distributed constant line shown in FIG. 17.

Next, a computational example of an input impedance frequency characteristic for the case where an output of the line shown in FIG. 15 is terminated in 50Ω (refer to FIG. 17) is shown in FIG. 18. With respect to even harmonics, the case of FIG. 18a becomes an ideally infinite impedance, while the case of FIG. 18b becomes zero. This is because for even harmonics only, the same conditions as for the distributed constant line shown in FIG. 12 are obtained. Accordingly, by using this coupled distributed constant line, it is possible to satisfy inverse F class or an F class load conditions for even harmonics.

(Odd Harmonic Processing Using Inverse F Class)

Regarding the method of carrying out odd harmonic processing, the case for inverse F class will be described first. In order to satisfy inverse F class load conditions, the line of FIG. 15a is used for even harmonic processing. As described previously, this line is equivalent to a distributed constant line having a length of ¼ the fundamental, with respect to odd harmonics.

Here, if a characteristic is considered for the case where a termination of a distributed constant line having a length of ½ the fundamental is made short circuit, since it is best to replace $f_0$ with $f_0/2$ in FIG. 13a, the input impedance becomes zero with respect to all harmonics, including the fundamental.

Figure 19:
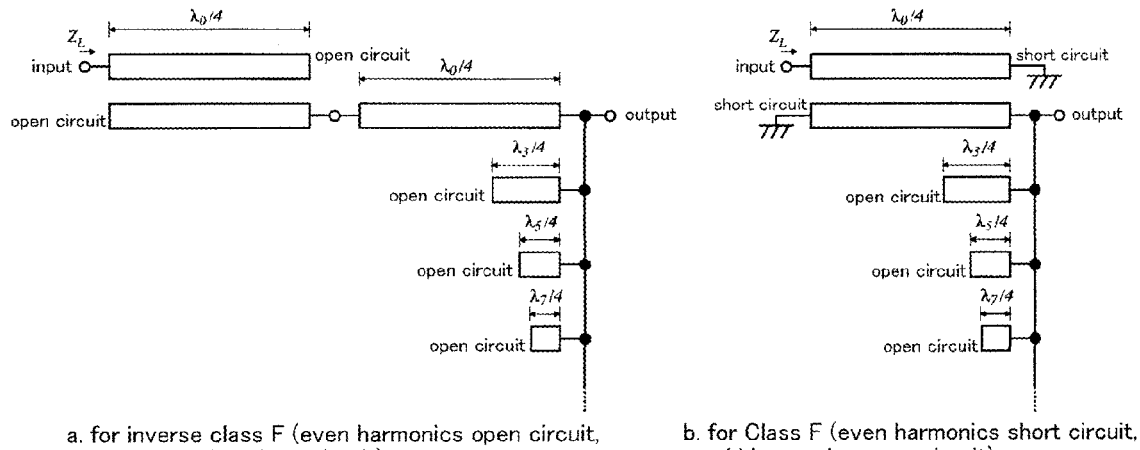
FIG. 19 is a drawing showing the structure of a harmonic processing circuit for an inverse class F (FIG. 19a) or a class F (FIG. 19b) amplifier
Figure 20:
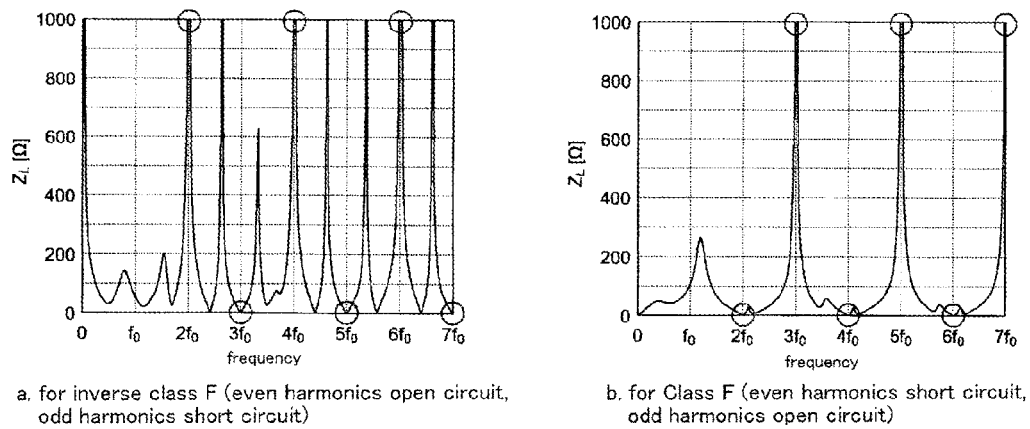
FIG. 20 is a graph showing an input impedance frequency characteristic in the case of connecting a load resistance of 50Ω to the output of the circuit shown in FIG. 19.

First, a distributed constant line having a length of ¼ the fundamental is further connected to an output terminal of the coupled distributed constant line of FIG. 15a, to give a distributed constant line having a length equivalent to ½ the fundamental, with respect to odd harmonics. In order to put the termination section of that distributed constant line in a short circuit state only for each of the odd harmonics, open termination distributed constant lines constituting a ¼ wave length with respect to each wavelength of the odd harmonics are only connected in a number corresponding to the number of harmonics to be processed (while some can be omitted) (refer to FIG. 19a). In this way, inverse class F conditions, such as zero impedance with respect to odd harmonics, are satisfied in the input impedance characteristic for the line overall (refer to FIG. 20a). FIG. 19a is equivalent to FIG. 1 with the harmonic processing sections taken out.

(Odd Harmonic Processing Using F Class)

Next, the case for F class will be described. In the case of F class as well, even harmonic processing is performed using the line of FIG. 15b, similarly to as described before.

On the other hand, with the characteristic for odd harmonics of this coupled distributed constant line shown in FIG. 16d, there is a 180° delay with respect to the characteristic of the distributed constant line having a length of ¼ the fundamental, regardless of what odd harmonic it is. Electrical length of 180° is equivalent to a standing wave interval, which means that an impedance characteristic at the input end becomes the same for every distributed constant line having a phase difference variation that is an integer number of times 180°. Accordingly, input impedance with respect to odd harmonics when the output terminals of the coupled distributed constant lines shown in FIG. 15b are short circuited becomes the ideal of infinity, the same as FIG. 13a.

In order to put output terminal of that distributed constant line in a short circuit state only for each of the odd harmonics, open termination distributed constant lines constituting a ¼ wave length of the fundamental are only connected in a number corresponding to the number of harmonics to be processed (while some can be omitted) (refer to FIG. 19b). In this way, class F conditions, such as ideal infinite impedance with respect to odd harmonics, are satisfied in the input impedance characteristic for the line overall (refer to FIG. 20b). FIG. 19b is equivalent to FIG. 6 with the harmonic processing sections taken out.

(Advantages Of Inverse F Class Amplifier, in Comparison with F Class Amplifier)

Figure 14:
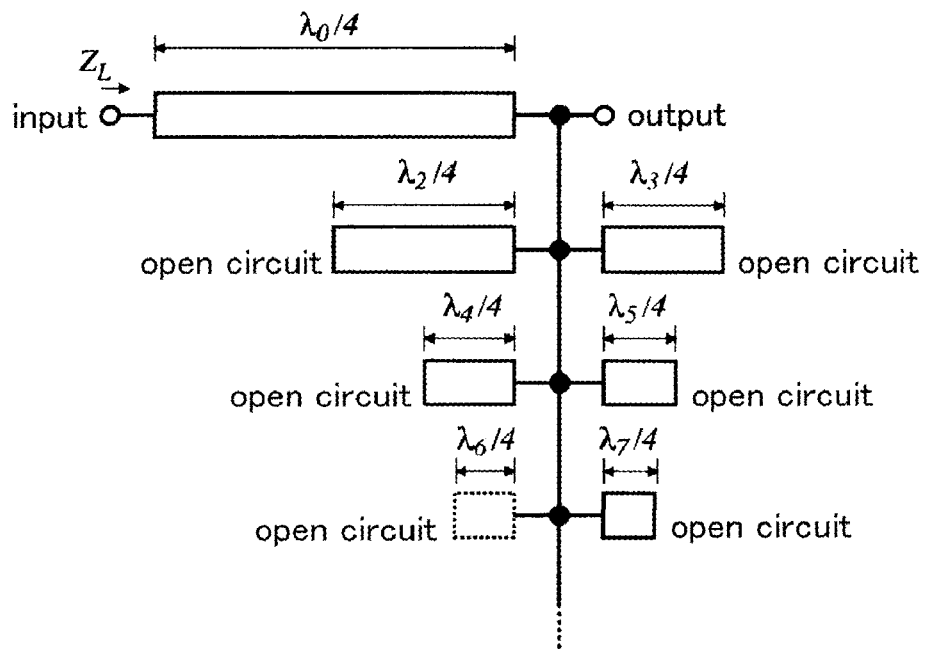
FIG. 14 is a circuit diagram showing a harmonic processing circuit for an F class amplifier of the related art (harmonic processing sections only).

Regarding making a microwave power amplifier highly efficient, an F class amplifier having the even harmonics short circuited and the odd harmonics open circuit is well known, and as described a circuit structure using distributed constant lines, capable of processing up to an arbitrary harmonic, has already been reported (refer to FIG. 14). In recent years, high efficiency amplifiers using the previously described inverse F class harmonic processing have been proposed (previously described non-patent publication 1), and further there have been reports of verification experiments using an external tuner to adjust up to a third harmonic (previously described non-patent publication 2), and reports of verification experiments of adjusting up to a third harmonic by combining a number of open termination distributed constant lines (non-patent publication 3). In these publications it is shown that inverse F class obtains higher efficiency than F class.

Figure 11:
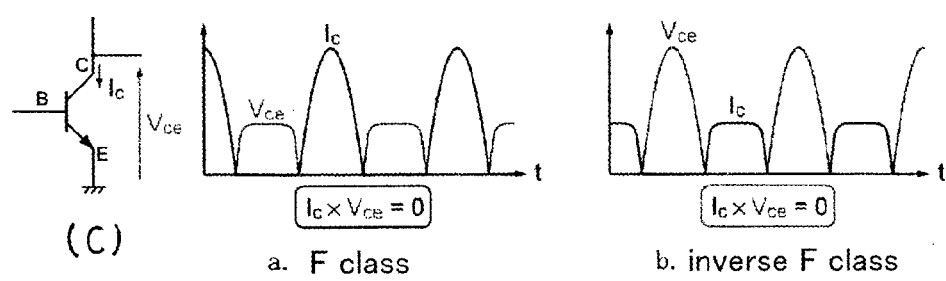
FIG. 11a and FIG. 11b are schematic drawings of a current waveform and a voltage waveform within the transistor of the ideal F class and inverse F class amplifiers.
FIG. 11c is an explanatory drawing for describing how to acquire the current and voltage of the transistor.
Figure 21:
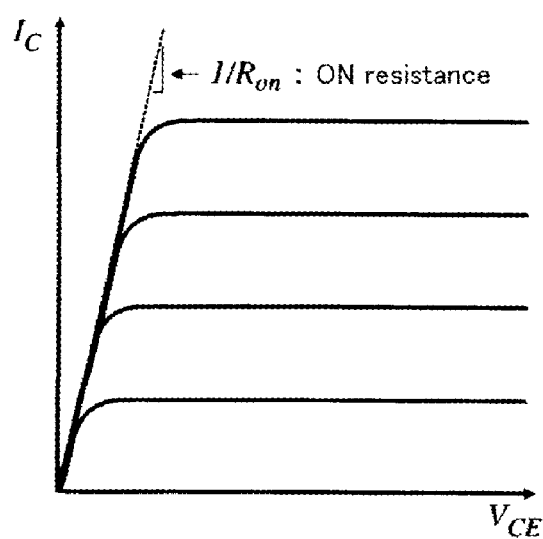
FIG. 21 is a graph showing a DC current voltage characteristic of a transistor.

Specifically, in the DC current voltage characteristics for a transistor shown in FIG. 21, an ON resistance determining the rising gradient has a significant effect on efficiency. In the case of obtaining the same fundamental output, from the difference in square-wave waveform and half-wave rectified waveform as shown in FIG. 11, the inverse F class has a larger voltage swing, and the amount of DC power consumption inside the transistor is small compared to that for F class. The fact that this tendency becomes more prominent with increase in ON resistance was shown from analysis.

With this inverse F class operation, since voltage applied to the transistor increases, it has been considered suitable for application to high voltage high output GaN type transistors that have been much discussed and increasing used in recent years, and it is predicted that realization of a higher output and more highly efficient amplifier will become possible.

Figure 22:
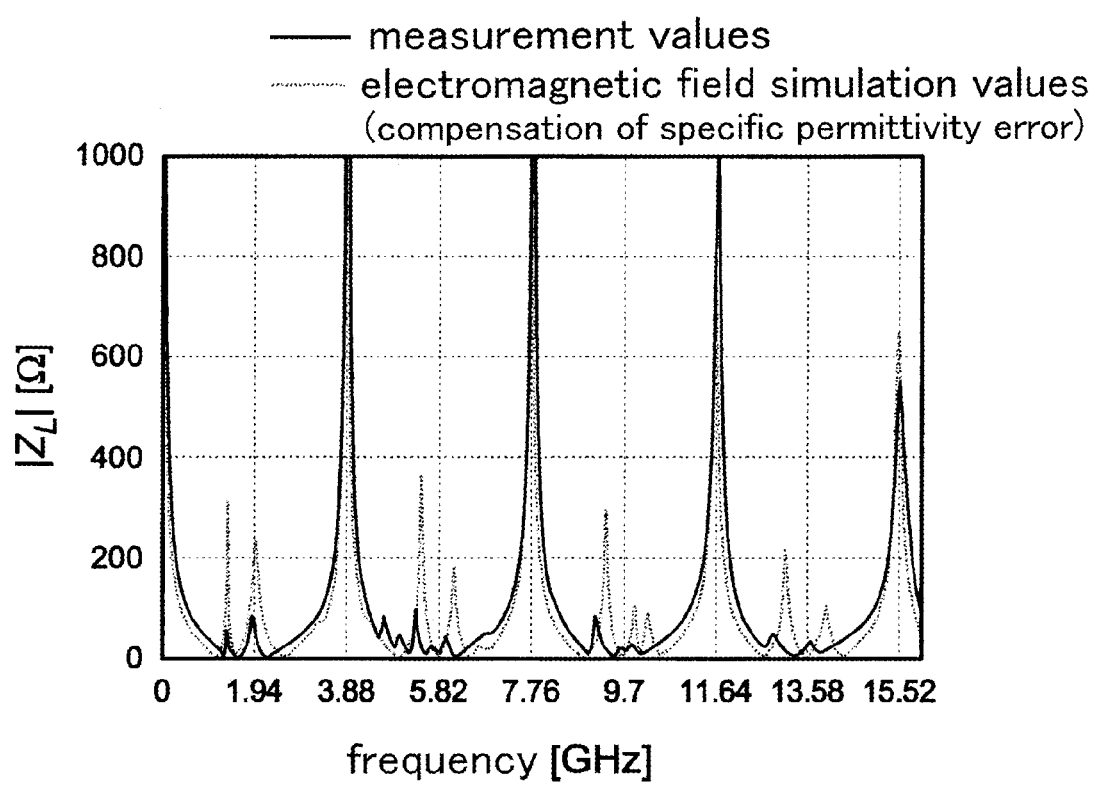
FIG. 22 is a graph showing actual measurement values for load impedance of the load circuit shown in FIG. 1.

Actual measurement values for load impedance of the load circuit shown in FIG. 1 are shown in FIG. 22. FIG. 3 was obtained by computation, but FIG. 22 was obtained by actual measurement. From FIG. 22, it will be understood that a load characteristic was obtained having 1 kΩ or greater for the even harmonics, and several tens of Ω or less for the odd harmonics. That is, from actual measurement also it was possible to confirm that a load impedance characteristic required for inverse F class operation was obtained.

Experimental conditions for this practical example were as follows.

(Experimental Conditions)

line substrate: low loss resin substrate (substrate thickness: 1.2 mm, specific permittivity $\epsilon_r$:3.5, dielectric tangent tanδ:0.002)

conductor: copper (thickness 18 microns or greater)

distributed constant line T: strip line (triplate line)

(signal line - ground surface distance: 0.4 mm, 0.8 mm (vertically asymmetrical)

distributed constant line CT : broadside coupling line (distance between signal lines CT1 and CT2: 0.2 mm, distance between signal line CT2 and ground surface G2: 0.4 mm, distance between signal line CT1 and ground surface G1: 0.6 mm (vertically asymmetrical))

distributed constant line CT (line width: 0.7 mm, line physical length: 20.7 mm)

distributed constant line T (line width: 4 mm, line physical length: 20.7 mm)

odd harmonic processing/open termination distributed constant lines (line thickness: 0.6 mm, line physical length T3: 6.4 mm, T5: 3.4 mm, T7: 2.7 mm)

fundamental reactance adjustment/open termination distributed constant line T*

(line width: 0.6 mm, line physical length: 28.6 mm)

load resistance: 50Ω

Figure 23:
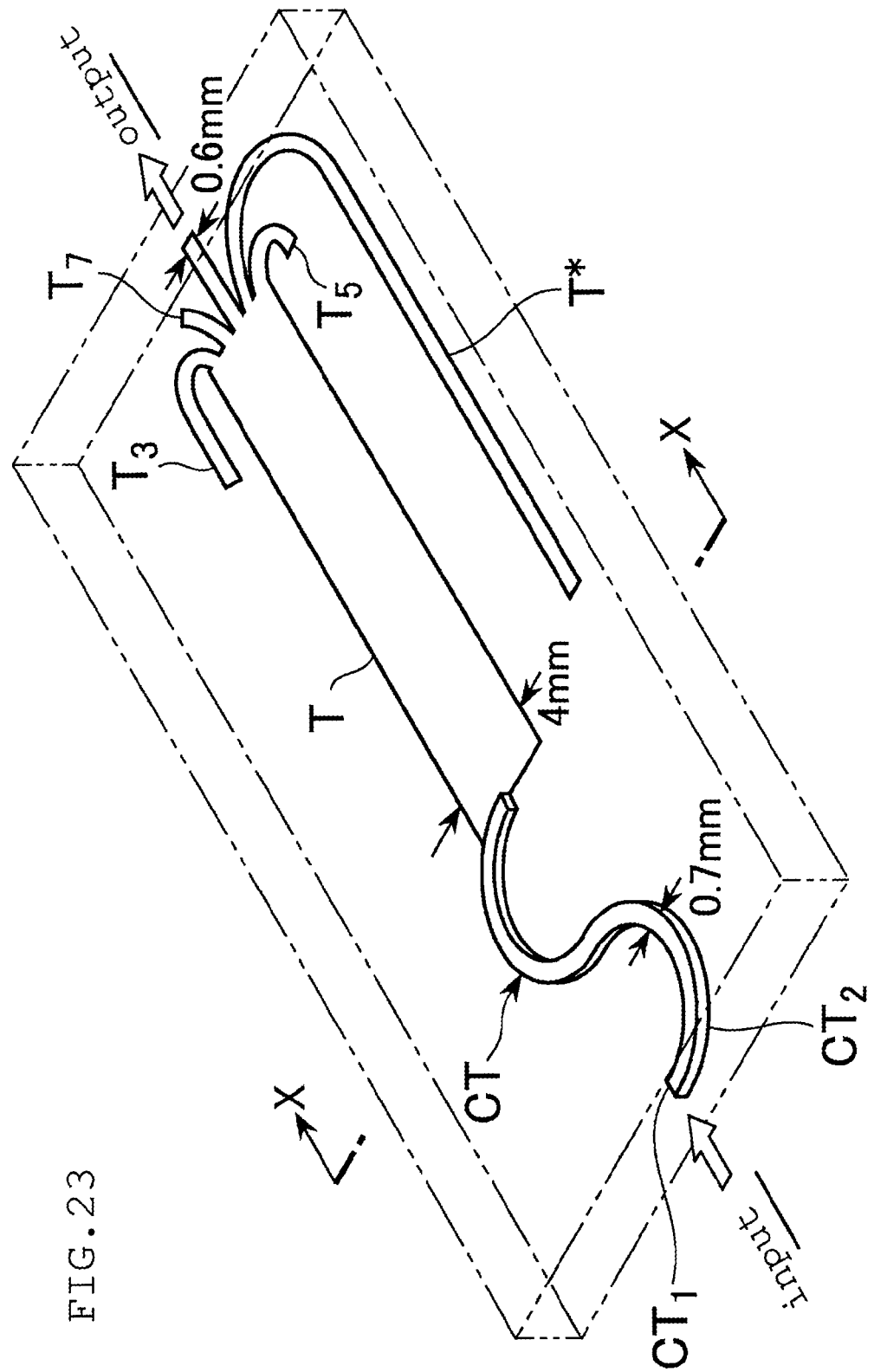
FIG. 23 is a perspective view showing the schematic structure of the load circuit uses in the practical example shown in FIG. 22.
Figure 24:
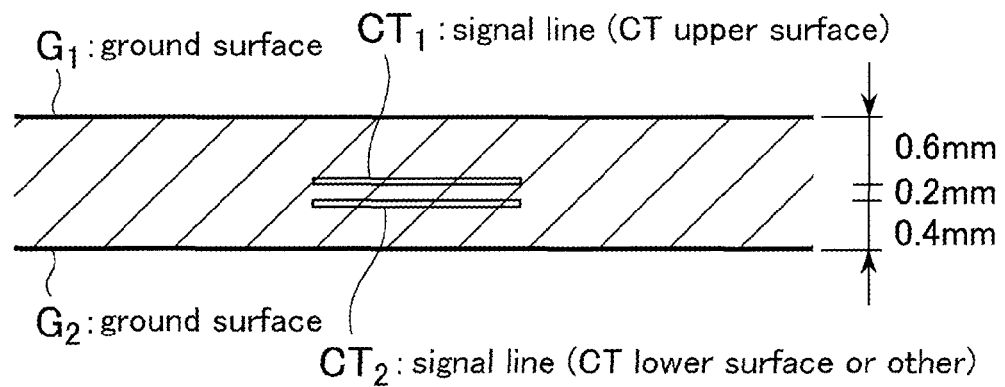
FIG. 24 is an essential enlarged cross sectional view along line X-X in FIG. 23.

The schematic structure of the load circuit uses in the practical example shown in FIG. 22 is shown in FIG. 23 and FIG. 24. The basic structure of this load circuit is the same as the circuit shown in FIG. 1. However, as shown in FIG. 23, the coupled distributed constant line CT of the circuit of the practical example is formed in an S-shape. In this way, for either of the signal lines CT1 and CT2, it is possible to make the length along with the left and right side surfaces (both end surfaces in the width direction) the same. By doing this there is the advantage it is possible to reduce fluctuations in the characteristic of the couple distributed constant line CT.

The invention claimed is:

1. A harmonic processing circuit, connected between an output terminal of an amplifier and a load resistance, for processing harmonics appearing at the output terminal of the amplifier, comprising:

a first impedance adjustment section and a second impedance adjustment section, wherein the first impedance adjustment section comprises a coupled distributed constant line;

the coupled distributed constant line receive as input the output of the amplifier, and have a length of ¼ the wavelength (λ) of the fundamental of the output of the amplifier, and wherein the coupled distributed constant line comprises an input side distributed constant line and an output side distributed constant line coupled with the input side distributed constant line so that the coupled distributed constant line process even harmonics at the coupled distributed constant line, and wherein the first impedance adjusting section is configured to adjust input impedance with respect to the even harmonics to one of effectively infinity or zero; and the first impedance adjusting section and the second impedance adjustment section are configured to adjust input impedance with respect to the odd harmonics to the other of effectively infinity or zero.

2. The harmonic processing circuit of claim 1, wherein the first impedance adjusting section is configured to adjust input impedance with respect to the even harmonics to effectively zero; and the first impedance adjustment section and the second impedance adjustment section are configured to adjust input impedance with respect to the odd harmonics to effectively infinity; and wherein the second impedance adjustment section comprises a plurality of open termination distributed constant lines connected in parallel with each other and to the output terminal of the coupled distributed constant line, and wherein the plurality of open termination distributed constant lines respectively have line lengths L represented by $L=\lambda/(4m)$ (where λ is the fundamental wavelength, and $m$ is a positive odd number other than 1).

3. The harmonic processing circuit of claim 1, wherein the first impedance adjusting section is configured to adjust input impedance with respect to the even harmonics to effectively infinity;
- the first impedance adjustment section and the second impedance adjustment section are configured to adjust input impedance with respect to the odd harmonics to effectively zero;
- and wherein the second impedance adjustment section comprises a distributed constant line for $\lambda/2$ formation, connected to an output terminal of the coupled distributed constant line and having a length of ¼ the wavelength ($\lambda$) of the fundamental, and
- a plurality of open termination distributed constant lines connected in parallel with each other and to the output terminal of the distributed constant line for $\lambda/2$ formation, wherein
- the plurality of open termination distributed constant lines respectively have line lengths L represented by $L=\lambda/(4m)$ (where $\lambda$ is the fundamental wavelength, and $m$ is a positive odd number other than 1).

4. The harmonic processing circuit of claim 3, further comprising a compensating distributed constant line, connected to the output terminal of the distributed constant line for $\lambda/2$ formation, for compensating reactance components of the fundamental at the output terminal of the amplifier.

5. The harmonic processing circuit of claim 3, further comprising a reactance element, connected to the output terminal of the distributed constant line for $\lambda/2$ formation, for compensating reactance components of the fundamental at the output terminal of the amplifier.

6. An amplifier circuit, having, an input terminal of the distributed constant line of the harmonic processing circuit of claim 1 connected to an output terminal of the amplifier.

7. The amplifier circuit of claim 6, using an amplification transistor as the amplifier.

8. The amplifier circuit of claim 6, using a negative resistance two-terminal amplification element as the amplifier.

* * * * *